(12) United States Patent
Bauer et al.

(10) Patent No.: US 11,711,885 B2
(45) Date of Patent: Jul. 25, 2023

(54) METHOD OF MANUFACTURING PRINTED CIRCUIT BOARD ASSEMBLIES WITH ENGINEERED THERMAL PATHS

(71) Applicant: TTM Technologies North America, LLC, Santa Ana, CA (US)

(72) Inventors: Rick Bauer, East Syracuse, NY (US); Jerrad Martinson, East Syracuse, NY (US); Shane Hoffstatter, East Syracuse, NY (US); Doyle Laudal, East Syracuse, NY (US); Mike Lugert, East Syracuse, NY (US); Mike Len, East Syracuse, NY (US)

(73) Assignee: TTM Technologies, Inc., Santa Ana, CA (US)

( * ) Notice: Subject to any disclaimer, the term of this patent is extended or adjusted under 35 U.S.C. 154(b) by 0 days.

(21) Appl. No.: 17/162,773

(22) Filed: Jan. 29, 2021

(65) Prior Publication Data

US 2021/0243880 A1 Aug. 5, 2021

Related U.S. Application Data

(60) Provisional application No. 62/968,807, filed on Jan. 31, 2020.

(51) Int. Cl.
*H05K 1/02* (2006.01)
*H05K 3/40* (2006.01)

(52) U.S. Cl.
CPC ......... *H05K 1/0203* (2013.01); *H05K 3/4076* (2013.01); *H05K 2203/1572* (2013.01)

(58) Field of Classification Search
CPC ......... H05K 3/4076; H05K 2203/1572; H05K 2201/09563; H05K 2203/0723; H05K 1/0204
See application file for complete search history.

(56) References Cited

U.S. PATENT DOCUMENTS 5,080,455 A * 1/1992 King ................. C03C 17/22
204/298.25
5,729,897 A * 3/1998 Schmidt ............... H05K 3/0041
427/97.8

(Continued)

FOREIGN PATENT DOCUMENTS

KR 100822662 B1 * 4/2008

OTHER PUBLICATIONS

International Search Report and Written Opinion from related International Application No. PCT/US2021/015810, dated Apr. 14, 2021; 12 pgs.

*Primary Examiner* — Peter Dungba Vo
*Assistant Examiner* — Jose K Abraham
(74) *Attorney, Agent, or Firm* — Polsinelli PC

(57) ABSTRACT

A printed circuit board (PCB) having an engineered thermal path and a method of manufacturing are disclosed herein. In one aspect, the PCB includes complementary cavities formed on opposite sides of the PCB. The complementary cavities are in a thermal communication and/or an electrical communication to form the engineered thermal path and each cavity is filled with a thermally conductive material to provide a thermal pathway for circuits and components of the PCB. The method of manufacturing may further include drilling and/or milling each cavity, panel plating the cavities and filling the cavities with a suitable filling material.

12 Claims, 3 Drawing Sheets

(56) References Cited

U.S. PATENT DOCUMENTS

| | | | | |
|---|---|---|---|---|
| 6,486,409 | B1 * | 11/2002 | Sako | H05K 3/4069 174/262 |
| 6,784,376 | B1 | 8/2004 | Huemoeller et al. | |
| 7,190,078 | B2 * | 3/2007 | Khandekar | H01L 23/49827 257/E21.582 |
| 9,468,101 | B2 * | 10/2016 | Su | H05K 1/0251 |
| 10,440,835 | B1 * | 10/2019 | Grober | H01L 21/486 |
| 10,531,577 | B1 * | 1/2020 | Grober | H05K 3/429 |
| 10,966,318 | B2 * | 3/2021 | Ismail | H05K 1/115 |
| 11,051,403 | B2 * | 6/2021 | Ifis | H05K 3/427 |
| 11,452,212 | B2 * | 9/2022 | Tuominen | H05K 1/115 |
| 11,483,927 | B2 * | 10/2022 | Ismail | H05K 3/42 |
| 11,510,316 | B2 * | 11/2022 | Ifis | H05K 1/115 |
| 2006/0141762 | A1 * | 6/2006 | Khandekar | H01L 21/486 257/E21.582 |
| 2010/0269336 | A1 * | 10/2010 | Mayder | H05K 1/0206 29/852 |
| 2010/0307807 | A1 * | 12/2010 | Noda | H05K 3/0038 29/874 |
| 2010/0307809 | A1 * | 12/2010 | Noda | H05K 3/4602 29/829 |
| 2012/0246925 | A1 * | 10/2012 | Hibino | H05K 3/0038 427/97.8 |
| 2012/0298413 | A1 * | 11/2012 | Mori | H01L 23/147 29/829 |
| 2013/0319737 | A1 | 12/2013 | Hurwitz | |
| 2015/0208514 | A1 * | 7/2015 | Thomas | H05K 3/429 427/97.8 |
| 2016/0183371 | A1 * | 6/2016 | Su | H05K 3/06 174/254 |
| 2016/0338202 | A1 | 11/2016 | Park et al. | |
| 2017/0064824 | A1 | 3/2017 | Kim et al. | |
| 2018/0110133 | A1 * | 4/2018 | Iketani | H05K 3/108 |
| 2019/0014667 | A1 * | 1/2019 | Bahl | H05K 3/06 |
| 2019/0159346 | A1 * | 5/2019 | Thomas | H05K 3/429 |
| 2019/0304877 | A1 * | 10/2019 | Mobley | H05K 3/102 |
| 2020/0043690 | A1 * | 2/2020 | Iketani | H01H 85/143 |
| 2020/0221578 | A1 * | 7/2020 | Chung | H05K 3/205 |
| 2020/0275583 | A1 * | 8/2020 | Lee | H05K 7/205 |
| 2020/0389983 | A1 * | 12/2020 | Bahl | H05K 3/0035 |

* cited by examiner

METHOD OF MANUFACTURING PRINTED CIRCUIT BOARD ASSEMBLIES WITH ENGINEERED THERMAL PATHS

CROSS-REFERENCE TO RELATED PATENT APPLICATIONS

This patent application claims the benefit under 35 U.S.C. § 119(e) of U.S. Patent Application Ser. No. 62/968,807, entitled "Printed Circuit Board Assemblies With Engineered Thermal Paths and Methods of Manufacture," filed on Jan. 31, 2020, which is incorporated herein by reference in its entirety.

FIELD

The disclosure is directed to methods for providing an improved thermal path for printed circuit boards. The method provides a cost-effective method to manufacture improved thermal path having a thermal performance typical of a coin approach.

BACKGROUND

Printed Circuit Board (PCB) Assemblies may be formed from multi-layer PCBs having Surface Mount Technology (SMT) components of integrated circuits (ICs). As SMT components and ICs require more power in combination with a continuing trend towards miniaturization, thermal management on the PCB assemblies becomes greater challenge to manage.

PCB assemblies typically have thermal conductivity ranging from 0.25 W/mK to 3 W/mK, which results in a high thermal resistance through the PCB and consequently large temperature variations in the PCB. Typical applications for dissipation of significant power use a thermal coin. Specifically, copper coins are inserted into a PCB to help conduct the heat away from heat sources, such as ICs, die, or other components, to a heat sink underneath the PCB. In the coin manufacturing process, a hole is cut in the PCB and a thermally conductive coin, such as a copper coin, is inserted into the hole. However, the current manufacturing process for producing PCBs with copper coins is labor intensive and expensive. As such, there exists a need for a more cost effective method to provide coin-like thermal pathways.

BRIEF SUMMARY

The disclosure provides a printed circuit board (PCB) with an engineered thermal path and methods for fabricating the PCB assembly. In one aspect, a printed circuit board assembly includes a printed circuit board having one or more layers. The printed circuit board has a first cavity in a top surface, wherein the first cavity is filled with a first thermal conductive material, and a second cavity in a bottom surface of the printed circuit board, wherein the second cavity is filled with a second thermal conductive material. The first cavity is in a thermal communication and/or an electrical communication with the second cavity to form a filled cavity structure as an engineered thermal and/or electrical path.

In another aspect, a printed circuit board (PCB) assembly includes a PCB comprising a plurality of layers having a plurality of traces and a plurality of conductive pads. The assembly also includes surface mount technology (SMT) components mounted on a top side of the PCB. The assembly also includes a first cavity in the top surface of the printed circuit board, wherein the first cavity is filled with a first thermal conductive material and a second cavity in a bottom surface of the printed circuit board, wherein the second cavity is filled with a second thermal conductive material. The first cavity is in a thermal communication and/or an electrical communication with the second cavity to form a filled cavity structure as an engineered thermal and/or electrical path.

In yet another aspect, a method for forming a printed circuit board having an engineered thermal and/or electrical path includes forming a first cavity in a top surface of the printed circuit board. The method further includes filling the first cavity with a first thermal conductive material. The method also includes forming a second cavity in a bottom surface of the printed circuit board, wherein the first cavity is in a thermal communication and/or an electrical communication with the second cavity to form a filled cavity structure as an engineered thermal and/or electrical path. Lastly, the second cavity is filled with a second thermal conductive material.

In a further aspect, a method is provided for forming a printed circuit board having an engineered thermal path. The method may include forming a first cavity in a top surface of the printed circuit board (PCB), and panel plating the PCB and the first cavity. The method may also include forming a second cavity in a bottom surface of the printed circuit board. The method may also include applying a photoresist mask to the PCB to expose the first cavity and the second cavity. The method may further include simultaneously plating to fill the first cavity and the second cavity with a thermal conductive material. The first cavity is in thermal communication, electrical communication, or both thermal and electrical communication with the second cavity to form a filled cavity structure as an engineered thermal path, an electrical path, or both.

Additional embodiments, aspects, and features are set forth in part in the description that follows, and in part will become apparent to those skilled in the art upon examination of the specification, or may be learned by the practice of the embodiments discussed herein. A further understanding of the nature and advantages of certain embodiments may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as various embodiments of the disclosure and should not be construed as a complete recitation of the scope of the disclosure, wherein.

DETAILED DESCRIPTION

Figure 1:
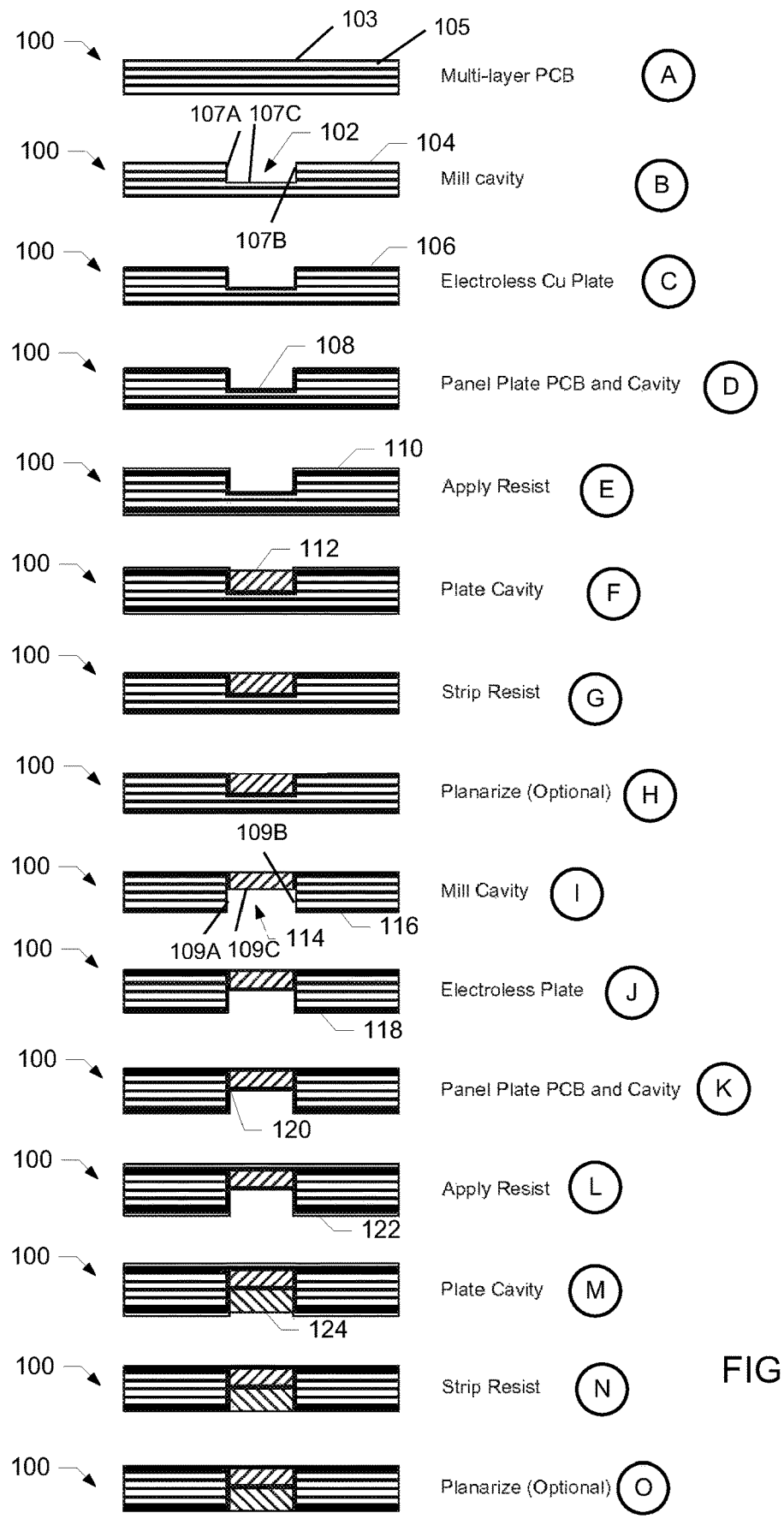
FIG. 1 depicts a flow process for providing a filled cavity structure according to one embodiment.

The disclosure may be understood by reference to the following detailed description, taken in conjunction with the drawings as described below. It is noted that, for purposes of illustrative clarity, certain elements in various drawings may not be drawn to scale.

The substrates of typically PCB assemblies have low thermal conductivity. Conversely, complex PCB assemblies may result in a high thermal resistance through the PCB assembly and consequently a large temperature delta. To reduce the temperature delta, the thermal resistance of the PCB assembly may be lowered using an engineered thermal pathway including a filled cavity structure, as disclosed herein. As such, according to one aspect, replacing the traditional pre-fabricated coins with the filled cavity structure can reduce fabrication costs while increasing PCB layout flexibility.

The present disclosure relates to a printed circuit board (PCB) having an engineered thermal path and a method of manufacturing the same. In one aspect, the PCB includes complementary cavities formed on opposite sides of the PCB. The complementary cavities are in thermal communication and/or electrical communication to form the engineered thermal path. Each cavity is filled with a thermally conductive material to provide a thermal pathway for circuits and components of the PCB. The method of manufacturing may further include drilling and/or milling each cavity, panel plating the cavities and filling the cavities with a suitable filling material.

In various aspects, the disclosed devices and methods provide a solid continuous void-free filled cavity structure that provides equivalent or improved thermal performance to a traditional coin approach. In other aspects, the filled cavity structure may be produced by filling a front side cavity and a backside cavity formed in the PCB with copper. By way of example and not limitation, the cavity may be milled or laser drilled and then filled following a series of plating steps.

In one aspect, the engineered thermal pathway or coin-like structure is created in a two-step process. For example, a first cavity is formed extending from the top surface of the PCB to approximately the center of the PCB depth and the first cavity is plated in preparation to be filled. Next, the PCB is flipped to the opposite side; a second cavity is formed that extends from the bottom surface towards the first copper filled cavity and the second cavity is plated. In another aspect, the process may create cavities and plate both sides of the PCB at the same time, rather than filling the top cavity and bottom cavity separately.

In various aspects, the cavities may be filled with copper, other suitable thermally conductive filling materials, or combinations thereof. In various aspects, it is desired that the filling material have a thermal conductivity in a range from 0.25 W/mK to 1200 W/mK. As used herein, thermal conductivity is a measure of a material to conduct heat. By way of example and not limitation, the filling material may include conductive materials such as copper, solder, gold, silver, nickel, aluminum, thermally conductive materials, and conductive polymers (e.g. conductive epoxies). Filling materials may also include non-conductive materials, such as non-conductive polymers (e.g. non-conductive epoxies). In various aspects, the filling materials can be selected, formulated, or otherwise engineered to provide a desired thermal performance (for example, to maximize specific heat (Cp) or thermal conductivity (K)) or stress reduction (for example, to match the coefficient of thermal expansion (CTE) of the PCB substrate or to provide a low modulus of elasticity (E)).

FIG. 1 depicts a method or flow process for manufacturing a PCB with a filled cavity structure according to one aspect. As shown, a PCB 100 containing one or more layers is provided at step A. The PCB 100 may include multiple layers 103 having a plurality of traces and a plurality of conductive pads. In one aspect, the top and bottom layers 103 are conductive. For example, the top and bottom layers 103 can be copper foil. The layers 105 adjacent to the top and bottom layers 103 are insulating layers and may be formed of fiber-reinforced glasses embedded in epoxy, for example.

Next, a first cavity 102 is mechanically drilled, or milled, or otherwise formed in a top surface 104 of the PCB 100 to extend into the PCB. The first cavity 102 includes two side surfaces 107A-B and a bottom surface 107C between the two side surfaces 107A-B. In one aspect, drilling cuts axially and generates cylindrical holes, while milling can cut both axially and laterally. In various aspects, the first cavity 102 may be formed and may have any shape or cross-section, including but not limited to a circle, a square, another quadrilateral, or another polygon shape. After forming the first cavity 102 in the PCB 100, the top side of the PCB is electroless plated with copper to form an electroless plated copper layer 106 at step C. The copper layer 106 covers the top surface 104, the two side surfaces 107A-B, and the bottom surface 107C of the first cavity 102. The electroless copper plating creates a uniform layer of metal regardless of the geometry of the surface. Moreover, the electroless copper plating can be applied to non-conductive surfaces.

The top surface 104 and the first cavity 102 are further panel plated or electroplated with a metal to form an electroplated layer 108 over the electroless plated copper layer 106 at step D. In the panel plating, the entire top side of the PCB including the top surface 104 and the side surfaces 107A-B and the bottom surface 107C of the cavity 104 is plated up and the metal builds up on all top surfaces of the PCB. The panel plated metal layer, e.g. plated Cu layer, may be at least 2 mils thick, which may be thick enough to provide stability. In some variations, the panel plated metal layer may be up to 6 mils thick, among others.

In one aspect, a photoresist mask or layer 110 or a similar shielding material is placed on the top surface 104 at step E. The photoresist mask 110 is patterned to expose the first cavity 102, but to cover the top surface 104. Then, the first cavity 102 is filled with a filling material to form a filled first cavity. As an example, the first cavity 102 may be plated with a filling material 112 at step F. In various aspects, the filling material 112 may be copper; however, one or more other filling materials or combinations thereof may be used. After plating the first cavity 102, the photoresist mask 110 is stripped or otherwise removed at step G. Lastly, if so desired, the top surface 104 of the PCB 100 and the exposed surface of the filling material 112 in the first cavity 102 may be optionally planarized, at step H, to provide a uniformly flat surface.

The PCB 100 is then drilled, milled, or otherwise modified to provide a second cavity 114 on the bottom surface 116 of the PCB 100 at step I. The second cavity 114 extends into the PCB from the bottom surface 116 and includes two side surfaces 109A-B and a bottom surface 109C between the two side surfaces 109A-B. In one aspect, the PCB 100 is drilled until the panel plating 108 is reached to ensure thermal connectivity with the filling material 112 of the first cavity 102.

Similar to the creation of the first cavity 102, the bottom surface 116 and second cavity 114 are electroless plated with copper to form an electroless plated copper layer 118 at step J. The bottom side and the second cavity 114 are further panel plated or electroplated to form an electroplated layer 120 at step K. The layer 120 is plated over the electroless plated copper layer 118. The layer 120 covers the bottom surface 116 of the PCB, the two side surfaces 109A-B, and the bottom surface 109C of the second cavity 114.

Next, the bottom surface 116 is covered by a photoresist mask or layer 122 or a similar shielding material at step L. The photoresist mask 122 is patterned to expose the second cavity 114, but to cover the bottom surface 116. Then, the second cavity 114 is plated with a filling material 124 to form a filled second cavity at step M. In various aspects, the filling material 124 is copper; however, one or more other filling materials or combinations thereof may be used. After plating the cavity 114, the photoresist mask 122 is stripped or otherwise removed at step N. Lastly, if so desired; the bottom surface 116 of the PCB 100 and the exposed surface of the filling material 124 in the cavity 114 are optionally planarized, at step O, to provide a uniformly flat surface.

In some aspects, the filled cavity structure includes the filled first cavity in a thermal communication and/or an electrical communication with the filled second cavity. The filled cavity structure provides an engineered thermal and/or electrical path.

Figure 3:
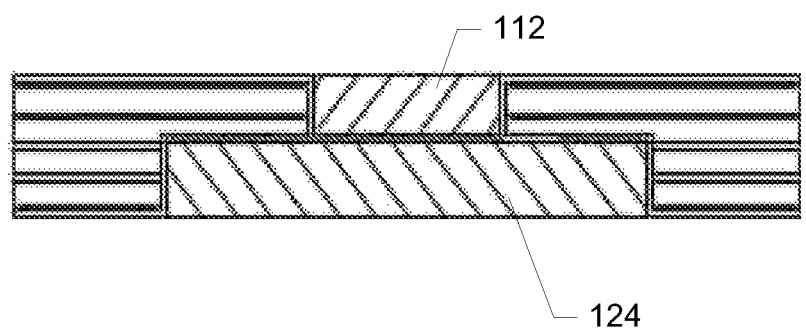
FIG. 3 is a cross-sectional view of a PCB with an engineered thermal path according to one embodiment.

The filled cavity structure or the thermal path and/or electrical path may have different shapes, which can be created by changing the cavity patterns. The cavity structures may also differ between the top and bottom sides, or the front and back sides. In one example, a thermal path and/or an electrical path having a "T" or inverted "T" shape, as seen in FIG. 3, may be formed. It is desirable for the top and bottom cavities to be adjoining or overlapping orientation.

Figure 2:
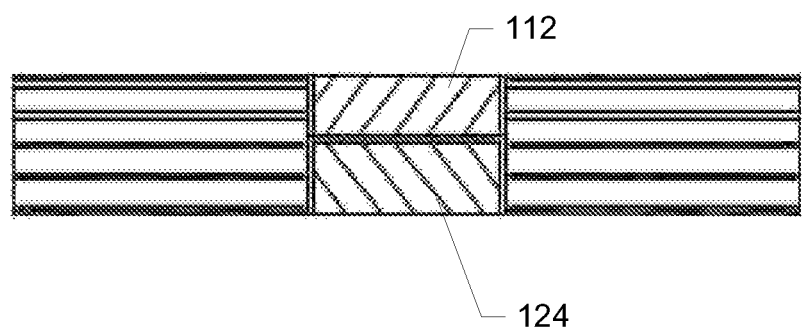
FIG. 2 is a cross-sectional view of a PCB with an engineered thermal path according to one embodiment.

In various aspects, the second cavity 114 may be identical in size and shape to the first cavity 102, as shown in FIG. 2. Alternatively, the second cavity 114 may be a different size or shape than the first cavity 102, as shown in FIG. 3. Further, as shown in FIGS. 2 and 3, it may be desirable for the first and second cavities to be adjoining or have an overlapping orientation.

It will be appreciated by those skilled in the art that the shape and dimensions in the cavities may vary to obtain various thermal paths and/or electrical paths. Multiple factors may affect the shape and dimensions of the cavities, including PCB dimensions in x, y, and z directions, number of layers, density of traces, sizes of traces, dissipated power on the top side of the PCB, efficiency of heat sink on the bottom side of the PCB, among others.

In various aspects, the first and second cavities can have the same of different filling material. For example, the first cavity may be filled with a material having a CTE matched to that of the SMT component mounted above it, while the second cavity may be filled to maximize heat transfer.

In various aspects, the filling material 112, 124 may be a solid plated copper fill. In other aspects, the filling materials 112, 124 can be other be thermally conductive filling material, including but not limited to copper, silver (Ag), nickel (Ni), tin (Sn), or gold (Au), among others or other conductive materials with similar properties or combinations thereof. Ag has higher thermal and electrical conductivities than copper (Cu), but is more costly than Cu. The thermal and electrical conductivities of Cu are better than Au. Ni and Sn can be used, but have lower thermal and electrical conductivities than Cu and Au. In some embodiments, any material that will plate to Cu can be used. In various aspects, it may be desirable to use a material having a combination of high thermal conductivity, high electrical conductivity, and low cost.

In various aspects, the filling material in the cavities may be a solid plated copper. In other aspects, the filling materials can be other thermally conductive material, including but not limited to solid silver, or solid gold, other equivalent materials with similar properties or combinations thereof. Additionally, in some aspects, the process may create cavities and plate both sides of the PCB at the same time, rather than filling the top cavity and bottom cavity separately as illustrated in FIG. 1.

Figure 4:
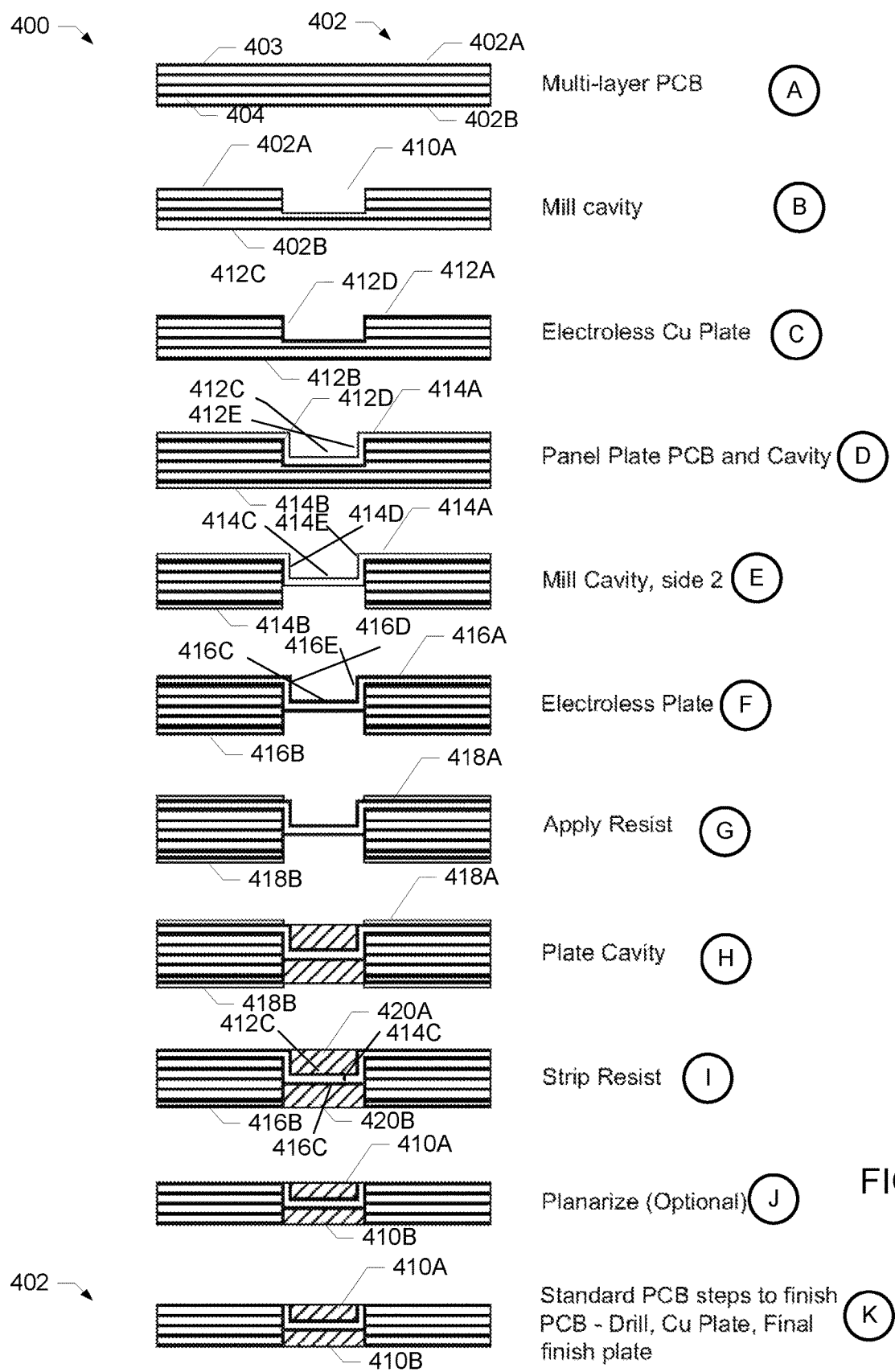
FIG. 4 depicts a flow process for providing a filled cavity structure according to another embodiment.

FIG. 4 depicts a flow process for providing a filled cavity structure according to another embodiment. As shown, a process 400 may include steps A-K. The process 400 includes manufacturing a PCB stop before a final exterior layer etching (i.e. stop after final lamination build-up) at step (A). As shown, a PCB 402 containing multiple layers 403 and 404 is provided. The PCB 402 includes a top surface 402A and a bottom surface 402B. In one aspect, the top and bottom layers 403 are conductive. For example, the top and bottom layers 403 can be copper foils. The layers 404 adjacent to the top and bottom layers 403 are insulating layers, for example, formed of fiber-reinforced glasses embedded in epoxy.

Next, mechanical drilling and/or milling or laser drilling the top side cavity is performed to partially extend through the PCB and pass the centerline of the PCB at step (B). As shown, a top cavity 410A is drilled, milled, or otherwise formed to extend into the PCB from the top surface 402A. The drill operation cuts axially and generates cylindrical holes, while the mill operation can cut both axially and laterally.

After forming the top cavity 410A in the PCB 402, the PCB 402 is electroless plated with a metal to form a first electroless plated metal layer (e.g. copper) at step (C). The first electroless plated metal layer includes a top portion 412A and a bottom portion 412B over the PCB, and also side portions 412D and 412E as well as bottom portion 412C in the top cavity 410A. The electroless copper plating creates a uniform layer of metal regardless of the geometry of the surface. Moreover, the electroless copper plating can be applied to non-conductive surfaces.

The top side and cavity are further panel plated or electroplated to form a panel plated metal layer, which includes a top portion 414A and a bottom portion 414B of the PCB, and also a bottom portion 414C and side portions 414D-E of the top cavity 410A, at step (D). The PCB is panel plated by using an electroplating process. The panel plating builds up on all exposed surfaces. The panel plated metal layer, e.g. plated Cu layer, may be at least 2 mils thick, which may be thick enough to provide stability. In some variations, the panel plated metal layer may be up to 6 mils thick, among others.

It will be appreciated that other conductive materials, for example, silver, gold, nickel, tin, among others, may be used in the electroless plating and electroplating. In some variations, any metal or material that will plate to copper can be used. It is desirable that the material have high thermal and electrical conductivity, and low cost.

Next, milling or laser drilling the bottom side cavity is performed at step (E). As shown, a bottom cavity 410B is drilled, milled, or otherwise formed to extend into the PCB from the bottom surface 402B. Then, the PCB 402 is electroless plated with a metal to form a second electroless plated metal layer (e.g. copper), which includes a top portion 416A and a bottom portion 416B of the PCB, and also a bottom portion 416C and side portions 416D-E of the bottom cavity 410B, at step (F).

The process 400 may include applying photoresist masks or layers over the electroless plated top and bottom portions 416A-B. The photoresist masks are configured to expose the top and bottom cavities 410A-B. Then, the top cavity 410A and the bottom cavity 410B are further panel plated or electroplated to fill the top and bottom cavities with plating build-up layers 420A and 420B on the top and bottom sides of the PCB at step (H). The plating build-up layers 420A and 420B are thick enough to fill the top and bottom cavities 410A-B. In various aspects, the filling material in the top and bottom cavities is copper; however, one or more other fill materials or combinations thereof may be used.

As shown in FIG. 4, a filled cavity structure may include the filled first and second cavities, which may be adjoined by the panel plated bottom portion 414C and electroless portion 412C and 416C. The filled cavity structure can be used as an engineered thermal path, an electrical path, or both.

In some aspects, the filled cavity structure may include the filled first cavity adjoined with the filled second cavity. In other aspects, the filled cavity structure may include the filled first cavity adjoined with the filled second cavity by using a conductive material, such as a plated metal, among others.

The photoresist masks or layers 418A-B can be stripped off at step (I) to expose the electroless plated top and bottom portion 416A-B. Then, the process 400 may optionally include planarization of the top and bottom of the PCB at step (J) to form the filled top and bottom cavities 410A-B. As shown, the electroless plated portion 416A-B may be removed by planarization. In addition, the panel plated top and bottom portions 414A-B may be removed by planarization to expose the top and bottom surfaces 402A-B of the PCB. The PCB is then processed by normal operations to complete the manufacturing process, including drilling, Cu plating, and final finish plating, at step (K).

In some aspects, the process 400 may include electroless plating the top and bottom and the first cavity of the PCB prior to panel plating the PCB and the first cavity. In other aspects, the process 400 may include electroless plating the top and bottom and the first and second cavities of the PCB prior to simultaneously plating to fill the first cavity and the second cavity. In further aspects, the printed circuit board may include one or more plated or filled vias at discrete locations.

Having described several aspects and embodiments, it will be recognized by those skilled in the art that various modifications, alternative constructions, and equivalents may be used without departing from the spirit of the disclosure. Additionally, a number of well-known processes and elements have not been described in order to avoid unnecessarily obscuring the embodiments disclosed herein. Accordingly, the above description should not be taken as limiting the scope of the document.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the method and system, which, as a matter of language, might be said to fall there between.

The invention claimed is:

1. A method for forming a printed circuit board having an engineered thermal path, the method comprising:
    forming a first cavity in a top surface of the printed circuit board by drilling, milling, or a combination thereof into the top surface of the printed circuit board to a first depth;
    plating the first cavity and the top surface of the printed circuit board to form a first plated metal layer;
    filling the first cavity with a first thermal conductive material;
    forming a second cavity in a bottom surface of the printed circuit board by drilling, milling, or a combination thereof into the bottom surface of the printed circuit board to a second depth;
    plating the second cavity and the bottom surface of the printed circuit board to form a second plated metal layer; and
    filling the second cavity with a second thermal conductive material, wherein the filled first cavity is in thermal communication, electrical communication, or both thermal and electrical communication with the filled second cavity to form a filled cavity structure as an engineered thermal path, an electrical path, or both, wherein the first cavity is enclosed by first side surfaces coupled to a first bottom formed of a portion of the first plated metal layer, wherein the second cavity is enclosed by second side surfaces coupled to a second bottom formed of a portion of the second plated metal layer.

2. The method of claim 1, wherein the second cavity is formed to have different dimensions or a greater cross-sectional area than the first cavity.

3. The method of claim 1, wherein the second cavity is formed to have same dimensions as the first cavity.

4. The method of claim 1, wherein the second cavity is formed to be adjoining with the first cavity via the first and second plated metal layers.

5. The method of claim 1, further comprising planarizing at least one of the top surface and the bottom surface.

6. The method of claim 1, wherein the first thermal conductive material and the second thermal conductive material are selected from a group consisting of copper, tin, gold, silver, nickel, aluminum, conductive polymers, conductive epoxies, non-conductive polymers, and combinations thereof.

7. The method of claim 1, wherein the first thermal conductive material and the second thermal conductive material have a same composition or different compositions.

8. A method for forming a printed circuit board having an engineered thermal path, the method comprising:
    forming a first cavity in a top surface of the printed circuit board (PCB) by drilling, milling, or a combination thereof into the top surface of the printed circuit board to a first depth;
    plating the PCB and the first cavity to form a first plated metal layer;
    forming a second cavity in a bottom surface of the printed circuit board by drilling, milling, or a combination thereof into the bottom surface of the printed circuit board to a second depth;
    plating the PCB and the second cavity to form a second plated metal layer;
    applying a photoresist mask to the PCB to expose the first cavity and the second cavity; and
    simultaneously plating to fill the first cavity and the second cavity with a thermal conductive material, wherein the first cavity is in thermal communication, electrical communication, or both thermal and electrical communication with the second cavity to form a filled cavity structure as an engineered thermal path, an electrical path, or both, wherein the second cavity is formed to be directly adjoining with the first cavity via the first and second plated metal layers, wherein the first cavity is enclosed by first side surfaces coupled to a first bottom formed of a portion of the first plated metal layer, wherein the second cavity is enclosed by second side surfaces coupled to a second bottom formed of a portion of the second plated metal layer.

9. The method of claim 8, wherein the second cavity is formed to have different dimensions or a greater cross-sectional area than the first cavity.

10. The method of claim 8, wherein the second cavity is formed to have same dimensions as the first cavity.

11. The method of claim 1, wherein one of the first or second plated metal layer has a thickness ranging from 2 mils to 6 mils.

12. The method of claim 8, wherein one of the first or second plated metal layer has a thickness ranging from 2 mils to 6 mils.

* * * * *